(12) United States Patent
Beckwith et al.

(10) Patent No.: US 11,278,885 B2
(45) Date of Patent: Mar. 22, 2022

(54) SYSTEMS AND METHODS FOR FABRICATING MICROFLUIDIC DEVICES

(71) Applicants: The Charles Stark Draper Laboratory, Inc., Cambridge, MA (US); Massachusetts Institute of Technology, Cambridge, MA (US)

(72) Inventors: Ashley Lynne Beckwith, Cambridge, MA (US); Jeffrey Borenstein, Newton, MA (US); Nathan Moore, Canton, MA (US); Daniel Doty, Arlington, MA (US); Luis Fernando Velásquez-García, Cambridge, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 345 days.

(21) Appl. No.: 16/116,637

(22) Filed: Aug. 29, 2018

(65) Prior Publication Data
US 2019/0329250 A1 Oct. 31, 2019

Related U.S. Application Data

(60) Provisional application No. 62/552,267, filed on Aug. 30, 2017, provisional application No. 62/611,513, (Continued)

(51) Int. Cl.
*B01L 3/00* (2006.01)
*B29C 64/393* (2017.01)
(Continued)

(52) U.S. Cl.
CPC ...... *B01L 3/502707* (2013.01); *B29C 64/135* (2017.08); *B29C 64/393* (2017.08); (Continued)

(58) Field of Classification Search
CPC ........... B01L 3/502707; B01L 2200/12; B33Y 80/00; B33Y 10/00; B81B 2201/058; (Continued)

(56) References Cited

FOREIGN PATENT DOCUMENTS

WO   WO-2017/027838 A1   2/2017
WO   WO-2017/089963 A1   6/2017

OTHER PUBLICATIONS

International Preliminary Report of Patentability on PCT PCT/US2018/048591 dated Mar. 12, 2020.
(Continued)

*Primary Examiner* — Catherine A. Simone
(74) *Attorney, Agent, or Firm* — Foley & Lardner LLP

(57) ABSTRACT

This disclosure describes techniques for fabricating a high-resolution, non-cytotoxic and transparent microfluidic device. A material can be selected based on having an optical property with a predetermined degree of transparency to provide viewability of a biological sample through the microfluidic device and a level of cytotoxicity within a predetermined threshold to provide viability of the biological sample within the microfluidic device. An additive manufacturing technique can be selected from a plurality of additive manufacturing techniques for fabricating the microfluidic device based on the selected material to provide a resolution of dimensions of one or more channels of the microfluidic device higher than a predetermined resolution threshold.

24 Claims, 6 Drawing Sheets

Related U.S. Application Data filed on Dec. 28, 2017, provisional application No. 62/649,016, filed on Mar. 28, 2018.

(51) Int. Cl.
*B29C 64/135* (2017.01)
*B81C 1/00* (2006.01)
*B33Y 10/00* (2015.01)
*B33Y 80/00* (2015.01)

(52) U.S. Cl.
CPC ....... *B81C 1/00071* (2013.01); *B01L 2200/12* (2013.01); *B33Y 10/00* (2014.12); *B33Y 80/00* (2014.12); *B81B 2201/058* (2013.01); *B81B 2203/0338* (2013.01); *Y10T 428/24744* (2015.01)

(58) Field of Classification Search
CPC ........ B81B 2203/0338; B81C 1/00071; B29C 64/393; B29C 64/135; Y10T 428/24744
See application file for complete search history.

(56) References Cited

OTHER PUBLICATIONS

International Search Report for PCT/US2018/048591 dated Oct. 16, 2018; 4 pages.

SYSTEMS AND METHODS FOR FABRICATING MICROFLUIDIC DEVICES

CROSS-REFERENCE TO RELATED APPLICATIONS

The present application claims priority to U.S. Provisional Patent Application 62/552,267, filed Aug. 30, 2017 and titled "SYSTEMS AND METHODS FOR 3D PRINTING FABRICATION OF MICROFLUIDIC TISSUE BIOPSY DEVICES," to U.S. Provisional Patent Application 62/611,513, filed Dec. 28, 2017 and titled "SYSTEMS AND METHODS FOR 3D PRINTING FABRICATION OF MICROFLUIDIC TISSUE BIOPSY DEVICES," and to U.S. Provisional Patent Application 62/649,016, filed Mar. 28, 2018 and titled "SYSTEMS AND METHODS FOR FABRICATING MICROFLUIDIC DEVICES," each of which is incorporated herein by reference in its entirety.

FIELD OF THE DISCLOSURE

The present disclosure is generally in the field of improved materials for use in making microfluidics devices using techniques such as 3D printing or DLP-SLA, the materials being biocompatible, producing high resolution features, high transparency to visible light, and low to no autofluorescence.

BACKGROUND OF THE DISCLOSURE

Microfluidics enable precise manipulation of small volumes of fluid for the investigation and analysis of microscopic physical, chemical, and biological phenomena. Device miniaturization and batch fabrication has traditionally translated into reductions in cost, materials, and times required for experimental execution. These attributes render microfluidic devices promising platforms for clinical investigations, which demand judicious and economical analysis methods as procurement of biological samples often comes at the expense of a patient's physical and financial well-being.

Many microfluidic devices developed for tumour microenvironment investigations are fabricated in polydimethylsiloxane ("PDMS"). While bio-inert, PDMS is not an ideal material for many applications due to its natural hydrophobicity and tendency to adsorb proteins and small-molecule drugs—a trait that can adversely impact the ability to control the concentration of soluble factors in experimental studies. Alternative fabrication methods and materials, such as injection-molded polystyrene or micro-machined glass and plastics, have been recently reported. While PDMS alternatives may remedy potential issues with drug adsorption, other problems with traditionally fabricated microfluidics persist.

Standard microfluidic fabrication techniques are often unable to produce certain geometries or features that facilitate device operation, e.g., standardized fluidic ports or effective approaches for bubble removal; failure to adequately consider device integration issues limits the translation of microfluidics from the research laboratory to practical clinical or industrial implementation. Furthermore, complex (e.g., three-dimensional) microfluidics are typically manufactured via multi-wafer stacks with substrates made of a plurality of materials that are individually patterned before alignment and bonding. Unfortunately, the construction of these devices is laborious, complex, and costly. Consequently, technically challenging assembly processes commonly result in low fabrication yield; material and structural limitations of the mainstream microfabrication process impose additional design constraints.

The systems and methods of the present disclosure provide materials and methods of manufacture to make biocompatible microfluidic devices having high degree of transparency to visible light, feature with high resolution (less than 100, 150, 200 or 250 microns), and low to no auto fluorescence.

The systems and methods of the present disclosure provide materials and methods which simplify and increase manufacturing yield of microfluidic devices for simulating dynamic processes involving biological samples by simplifying the process for constructing such microfluidic devices through monolithic fabrication.

The systems and methods of the present disclosure provide materials and methods enabling manufacture of microfluidic devices having a wide range of possible geometries not achievable using conventional lithographic, embossing, machining, or molding techniques.

SUMMARY OF THE DISCLOSURE

Solid freeform fabrication processes, such as 3D printing, are used to produce devices capable of ex vivo simulation of the dynamics of cell-tissue interactions. Advantages of this approach include the ability to monolithically integrate various features, including tissue capture regions, cell flow channels, resistance lines and fluidic connections, and bubble traps, rather than assembling components in a manner that runs the risk of introducing flow anomalies at connection points that may generate bubbles or sequester or damage flowing cells. Additive manufacturing (AM), i.e., the layer-by-layer creation of solid objects, using as a template, a computer-aided design (CAD) file, is a promising approach for implementing microfluidic systems. Accessibility of printing technologies and availability of printable materials that exhibit diverse mechanical, chemical, and optical properties make AM practical for many applications and user-experience levels. In addition to greater flexibility in the types of component geometries that can be created, AM simplifies the overall development of microfluidic devices and increases process yields. The potential for monolithic construction of a 3D-printed microfluidic device eliminates the need for subsequent adhesion or bonding processes, improving the consistency of its manufacturing by eliminating the need for alignment and by limiting operator involvement and potentially error in the fabrication. The true 3D capabilities also permit curved fluidic transitions and minimized dead volumes relative to conventional planar fabrication techniques. In addition, 3D-printing enables rapid and inexpensive iteration of prototypes, serving as an invaluable research tool for the development of novel microfluidic devices. Researchers have reported microfluidics on par or superior to counterparts made with standard microfabrication techniques, making complex devices that are unfeasible or difficult to implement by other means of manufacturing.

Useful to the implementation of these processes for making microfluidic devices, especially those that are for culturing or testing of biological samples such as tissues, tumor cells, or other types of eukaryotic or prokaryotic cells, is that the materials must be processable with the methods, have low to no cytotoxicity (see for example Leonhardt, et al. Curr. Dir. Biomed. Engineering 2(1):113-116 (2016), produce high resolution features (less than 100, 150, 200 or 250 microns), be highly transparent to visible light (390-700 nm) and/or have little to no autofluorescence.

Many materials may be useful, including polyetheretherketone ("PEEK"), polymethylacrylamide or polyacryalmide, or biodegradable polymers such as polyvinylalcohol, polycaprolactone and polylactide, and compolymers thereof A preferred material, described in the example, for photopolymerization to make a non-toxic microfluidic device is marketed as Pro3dure G10 (Pro3dure Medical GmbH, Dortmund, Germany). This material is described in EP 3209265 as including at least a poly(ethyl methacrylate) polymer (PEMA) or a poly(ethyl methacrylate)-poly(methyl methacrylate) copolymer (PEMA-PMMA). More broadly, the material includes at least 50%, or 60% or 70% based on the weight of poly(ethyl methacrylate) polymer or copolymer. In some embodiments, at least 90% and or at least 95% by mass of the polymeric material is poly(ethyl methacrylate) polymer or poly(ethyl methacrylate) copolymer, and a second monomer in which the poly(alkyl methacrylate) polymer is at least partially soluble, such as an alkyl acrylate and/or an alkyl methacrylate monomer, for example, the alkyl acrylate and/or alkyl methacrylate monomer is a monomer of methacrylate group methyl methacrylate, ethyl methacrylate, ethyl acrylate, ethoxyethyl acrylate, tetrahydrofurfuryl methacrylate, tetrahydrofurfuryl acrylate, isobornyl acrylate and/or isobornyl methacrylate and in some embodiments, ethoxyethyl methacrylate. This polymeric material can further include a flexibilizer, and/or a catalyst, in particular an organic peroxide such as benzoyl peroxide and/or toluidine, or barbituric acid or a barbituric acid derivative, wherein the catalyst is, in some embodiments, in a concentration of 0.25-1 percent by mass. Representative flexibilizers include citric acid based, adipic acid, phthalic acid or aliphatic esters, particularly in some embodiments 1,2-cyclohexanedicarboxylic acid-diisononyl esters.

An illustrative device described below was made using the materials and methods integrating trapping devices with other fluidic components and was created using 3D printing with material choices that permit precise control over device dimensions, completely monolithic fabrication, optical clarity and low autofluorescence, bio-compatibility, and non-cytotoxicity.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing.

DETAILED DESCRIPTION OF THE DISCLOSURE

Figure 1:
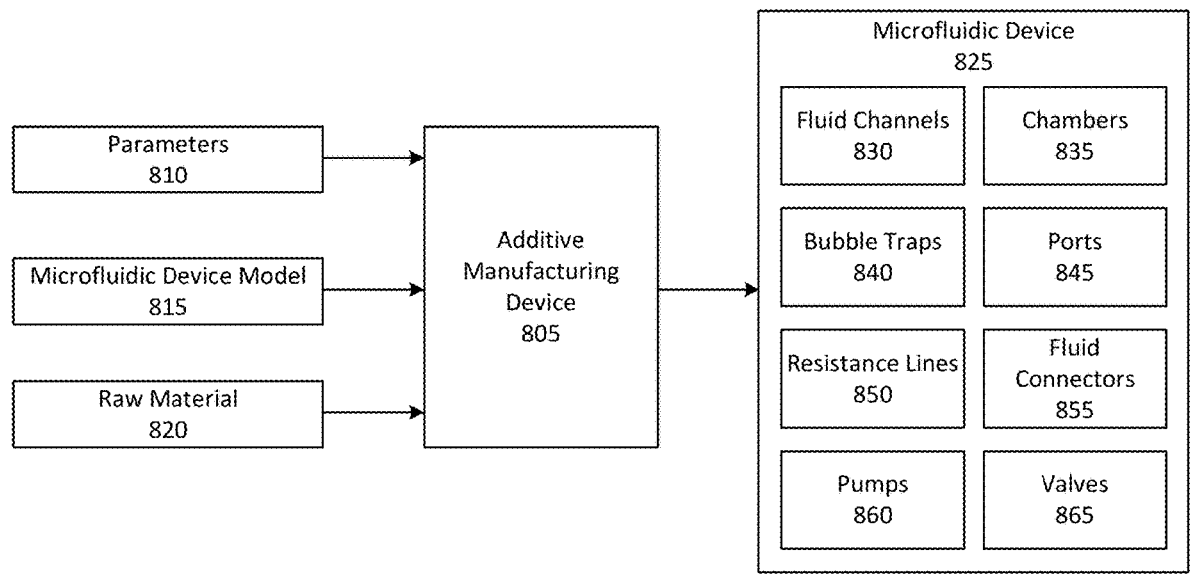
FIG. 1 is a block diagram of a system for fabricating a microfluidic device, according to an illustrative implementation.

Additive manufacturing (AM), i.e., the layer-by-layer creation of solid objects, using as a template, a computer-aided design (CAD) file, is a promising approach for implementing microfluidic systems. Accessibility of printing technologies and availability of printable materials that exhibit diverse mechanical, chemical, and optical properties make AM practical for many applications and user-experience levels. In addition to greater flexibility in the types of component geometries that can be created, AM simplifies the overall development of microfluidic devices and increases process yields. The potential for monolithic construction of a 3D-printed microfluidic device eliminates the need for subsequent adhesion or bonding processes, improving the consistency of its manufacturing by eliminating the need for alignment and by limiting operator involvement and potentially error in the fabrication. The true 3D capabilities also permit curved fluidic transitions and minimized dead volumes relative to conventional planar fabrication techniques. In addition, 3D-printing enables rapid and inexpensive iteration of prototypes, serving as an invaluable research tool for the development of novel microfluidic devices. Researchers have reported microfluidics on par or superior to counterparts made with standard microfabrication techniques, demonstrating as well complex devices that are unfeasible or difficult to implement by other means of manufacturing.

Although these methods are well known, not all materials can be utilized in the manufacture of microfluidic devices using AM processes such as 3DP, especially when additional parameters are required, including high resolution (features of less than 100, 150, 200 or 250 microns), transparency to visible light and no autofluorescence, and biocompatibility-lack of cytotoxicity.

I. METHODS OF MANUFACTURE

Different additive manufacturing techniques can be used to fabricate microfluidic devices. Representative techniques include stereolithography (SLA) or digital light projection stereolithography (SLA-DLP) and three-dimensional printing (3DP).

The methods may also be used to create molds where the device is made using micromolding techniques within the device.

The additive manufacturing technique is selected to provide a resolution of dimensions of one or more channels of the microfluidic device higher than a predetermined resolution threshold, for example, having a resolution of dimensions of one or more channels higher than a predetermined resolution threshold. For example, the additive manufacturing technique can be selected to provide a resolution of dimensions of one or more geometries or structures, such as channels (e.g., the fluid channels shown in FIG. 1) or other features of the microfluidic device higher than a predetermined resolution threshold. In some implementations, the additive manufacturing technique can be selected to fabricate pillars having diameters in the range of those described above in Table 1, or to fabricate channels having widths in the range of those described in Table 2. In some implementations, the predetermined resolution threshold can be selected based on a size of a biological sample to be contained within the device. For example, the biological sample can include a tissue fragment or other type of sample having a diameter of less than about 10 microns, less than about 20 microns, less than about 30 microns, less than about 40 microns, less than about 50 microns, less than about 75 microns, less than about 100 microns, less than about 150 microns, less than about 200 microns, less than about 300 microns, or less than about 400 microns. Thus, in some implementations, the additive manufacturing technique can be selected to have sufficient resolution to construct channels or chambers having diameters that are small enough to contain (i.e., hold in place or trap) biological samples of those sizes. In some implementations, the additive manufacturing technique can be selected to allow for the fabrication of channels having a height and a width in the range of about 0.01 millimeters to about 2.5 millimeters. In some implementations, the channels of the microfluidic device can have a height in the range of about 0.01 millimeters to about 2.5 millimeters and a width in the range of about 0.01 millimeters to about 2.5 millimeters. The plurality of parameters can include a predetermined parameter for layer thickness. In some implementations, the predetermined parameter for layer thickness can be in the range of about 0.001 millimeters to about 0.5 millimeters. In some implementations, the plurality of parameters can include a predetermined parameter for curing thickness offset. In some implementations, the predetermined parameter for curing thickness offset can be in the range of about 0.01 millimeters to about 0.3 millimeters. In some implementations, the channels of the microfluidic device can have a height in the range of about 0.01 millimeters to about 2.5 millimeters and a width in the range of about 0.01 millimeters to about 2.5 millimeters.

The method can include constructing, by an additive manufacturing device based on a model for the microfluidic device and a plurality of parameters, the microfluidic device with at least the predetermined degree of transparency and cytotoxicity below the predetermined threshold. Advantages of these properties include viewability of a biological sample through the microfluidic device and a level of cytotoxicity below a predetermined threshold to provide viability of the biological sample within the microfluidic device. The degree of transparency should be sufficient to resolve at least one of a single cell or a one-micron fluorescent marker of a single cell to indicate viability or identity of the biological sample. In some implementations, the level of cytotoxicity should be less than what is observed with materials such as PEEK.

Figure 2:
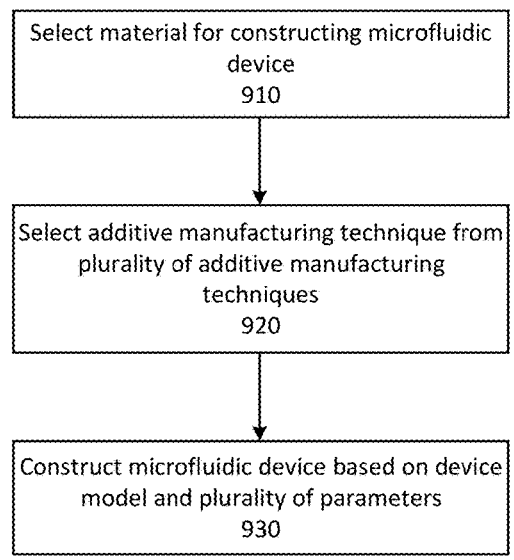
FIG. 2 is a flow chart of a method for fabricating a microfluidic device, according to an illustrative implementation.

The additive manufacturing device receives parameters to make a microfluidic device model, and raw material to construct a microfluidic device. The microfluidic device can include a variety of features, including fluid channels, chambers, bubble traps, ports, resistance lines, fluid connectors, pumps, and valves. FIG. 2 is a flow chart of a method for fabricating a microfluidic device. The device model can correspond to the microfluidic device model and the parameters can correspond to the parameters as shown in FIG. 1. In some implementations, data corresponding to the device model and data corresponding to the parameters can be transmitted to the additive manufacturing device, for example, from a remote computing device. In some other implementations, data corresponding to the device model and data corresponding to the parameters can be entered into the additive manufacturing device via a user interface provided by the additive manufacturing device. Generally, the device model can include information to be processed by the additive manufacturing device to cause the additive manufacturing device to construct the microfluidic device. In some implementations, the device model can include an STL file or other type of CAD file specifying the dimensions of each layer to be produced by the additive manufacturing device.

In some implementations, at least one dimension specified by the device model may differ from a corresponding dimension of the actual microfluidic device. Such a difference can help to compensate for deformations of the material that may occur during the additive manufacturing process. For example, in some implementations the device model may specify a combination of a channel width, a chamber width, a channel length, a chamber length, or a radius of curvature of a channel that is either larger or smaller than a corresponding dimension of the actual microfluidic device. In some implementations, the device model may also specify the orientation in which the microfluidic device is to be fabricated. In some implementations, the device model may specify that the device is to be fabricated in a direction substantially corresponding to a direction of fluid flow for the microfluidic device. The device model may specify that layers of the device should be built up sequentially, starting with layers near an inlet of the device and progressing towards layers of material near an outlet of the device (or vice versa). In some other implementations, another orientation may be specified by the device model. In some implementations, the parameters may also include one or more parameters that are selected to compensate for deformation of the material that may occur during the additive manufacturing process that may tend to cause the fabricated microfluidic device to have dimensions different than those specified in the model.

In some implementations, the plurality of parameters can be selected to maintain a level of over-curing within a predetermined over-curing range. In some implementations, the plurality of parameters can include a predetermined parameter for layer thickness. In some implementations, the predetermined parameter for layer thickness can be in the range of about 0.001 millimeters to about 0.5 millimeters. In some implementations, the plurality of parameters can include a predetermined parameter for curing thickness offset. In some implementations, the predetermined parameter for curing thickness offset can be in the range of about 0.01 millimeters to about 0.3 millimeters.

In some implementations, the method can include constructing the microfluidic device to include any combination of geometrics, complex or otherwise, such as any of the features shown in the microfluidic device of FIG. 1. In some implementations, the method can include constructing the microfluidic device to include any number of fluid channels or chambers. In some implementations, the method can include constructing the microfluidic device to include a location such as a chamber at which the biological sample is held in place within the microfluidic device for viewing. At least a portion of the microfluidic device adjacent to the location at which the biological sample is held in place, can have the optical property with the predetermined degree of transparency to provide the viewability of the biological sample.

In some implementations, the microfluidic device can include one or more bubble traps. For example, a bubble trap can be coupled to a fluid channel or a chamber and can be configured to remove air bubbles or other gas bubbles from a fluid that flows through the fluid channel or chamber to which it is coupled. The microfluidic device can include various ports, which can be configured to provide access to regions within the microfluidic device. For example, a port can be configured to provide access for a sensor (e.g., a pressure sensor, a flow sensor, a temperature sensor, or an optical sensor) to measure conditions in the microfluidic device. In some implementations, a port can be configured to allow a fluid sample or biological material sample to be introduced or retrieved from the microfluidic device. The microfluidic device can also include resistance lines and fluid connectors. For example, fluid connectors can be coupled to respective ports that may couple to fluid channels or chambers, to allow samples to be delivered into the microfluidic device or collected from the microfluidic device. The microfluidic device can also include pumps and valves. For example, the pumps and valves can be configured to control flow of fluid within the microfluidic device.

In some implementations, the present solution is directed to a method to fabricate a monolithic, fully 3D-printed microfluidic device. The microfluidic device can be formed to include combinations of any of the features described above, which may be integrated into the single monolithic device. For example, the microfluidic device can be formed to include a plurality of combinations of any of the features described above that may each serve as a separate device. Monolithic fabrication of multiple devices at one time may be achieved. Monolithic fabrication can also provide for high quality transitions between various features of the microfluidic device. For example, transitions between fluid channels or chambers can be formed in a smooth manner through additive manufacturing, relative to other manufacturing techniques. Similarly, junctions between edges of walls of a fluid channel or tapers (e.g., smooth variations in diameter) within a fluid channel can be fabricated more smoothly via additive manufacturing, which can help to promote laminar fluid flow within the microfluidic device. This is in contrast with other devices that may typically be fabricated using other techniques, such as lamination, that may not result in monolithic structures.

In some implementations, the method can also include post-processing steps that are performed on the microfluidic device after it is fabricated by the additive manufacturing device. For example, in some implementations, channels, chambers, and any other void existing within the microfluidic device can be flushed with a solvent, such as alcohol, to remove excess (e.g., uncured) material. The microfluidic device can also be dried with a gas, for example by using a nitrogen gun. In some implementations, microfluidic device can be cured in a UV chamber. In some implementations, the method can include flushing the channels of the microfluidic device with a solvent. The method can also include drying the microfluidic device with gas. The method can also include curing the microfluidic device in an ultraviolet (UV) chamber.

II. MATERIALS

Useful to the implementation of these processes for making microfluidic devices, especially those that are for culturing or testing of biological samples such as tissues, tumor cells, or other types of eukaryotic or prokaryotic cells, is that the materials be processable with the methods, have low to no cytotoxicity, produce high resolution features (less than 100 microns, less than 150 microns, less than 200 microns, less than 300 microns), be highly transparent to visible light (390-700 nm) and/or have little to no autofluorescence.

3D Printable materials include liquid resins that harness photopolymerization to create solid objects. In some implementations, the requirements of the printable material include (1) water tightness, (2) non-cytotoxicity over an extended period of time, (3) optical transparency, (4) little to no auto-fluorescence to enable data capture of the device operation via fluorescent images, and/or (5) high-resolution fabrication to be able to reproduce small features. In general, each material is printed using a specific method, resulting in distinct processing limitations. For example, the chemical composition of a certain printable material could facilitate defining very small features, but its viscosity could greatly affect the definition of narrow internal features (e.g., channels) given that uncured material needs to be removed from within the printed object to have a working feature. Also, some printing processes fill-in internal voids with photopolymerized support material.

Generally, a transparent material allows light to pass such that objects can be viewed through the material. For example, the material can be selected so that after processing it is substantially transparent to visible light (e.g., light having a wavelength of 390 nm-700 nm). In some implementations, the material is selected to allow at least about 40%, at least about 50%, at least about 60%, at least about 70%, at least about 80%, at least about 90%, at least about 95%, or at least about 99% of visible light to pass through it. This will also be affected by the thickness of the processed material, since a lower light transmission can be utilized when the material is thinner. In some implementations, the predetermined degree of transparency can be a degree of transparency that allows a single cell (or a single fluorescent marker having a diameter of about one micron) to be viewed through the material. In some implementations, the material is selected to have a low to no auto-fluorescence. This can help to prevent difficulty in distinguishing fluorescence of a marker inside the microfluidic device from fluorescence of the microfluidic device itself. In some implementations, the predetermined degree of transparency can be measured for a portion of the selected material having a predetermined thickness. For example, the predetermined degree of transparency may be achieved through a portion of the material having a thickness in the range of about 100 microns to about 2 mm, more preferably 800 microns. In some implementations, the predetermined degree of transparency may be achieved through a portion of the material having a thickness in the range of about 300 microns to about 500 microns. Generally, the predetermined degree of transparency may depend on the thickness of a wall of the microfluidic device through which biological sample (or a marker included in the sample) is to be viewed. In some implementations, the transparency of the material can be increased by polishing the material to reduce the surface roughness of the material. In some implementations, the material can be selected to have a degree of transparency in the range of any of the materials shown and described in connection with FIG. 6.

Figure 7:
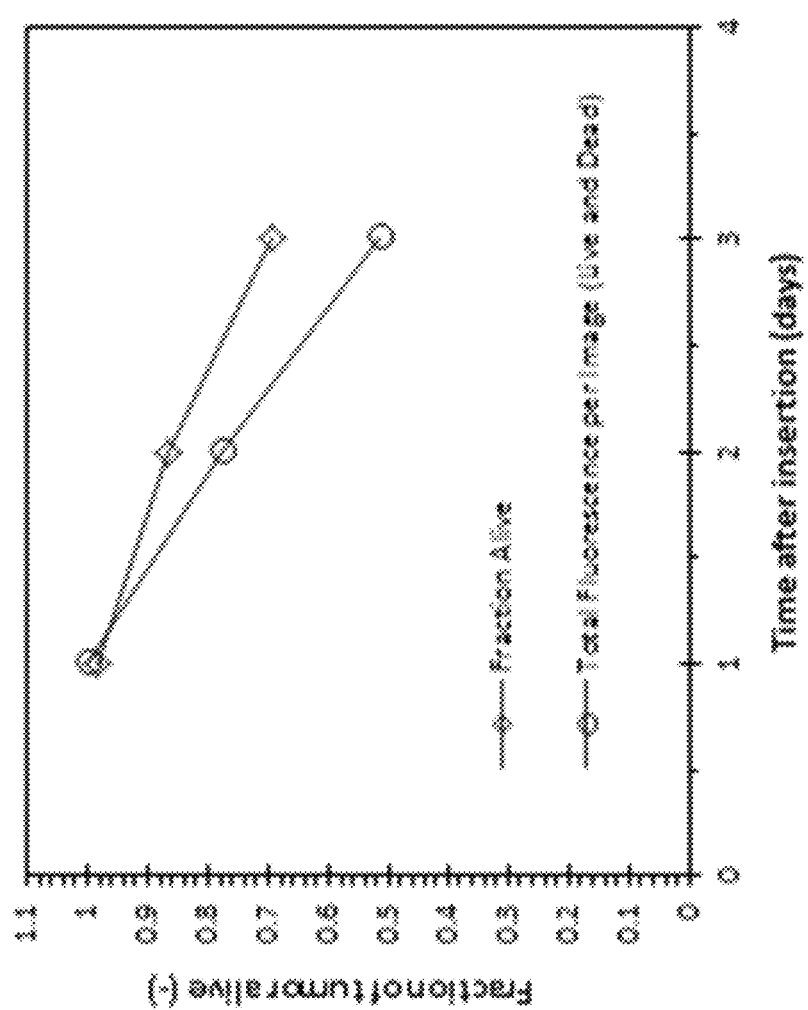
FIG. 7 is a graph illustrating the fraction of a live tumor fragment sustained within a 3D printed microfluidic device over 72 hours of perfusion, according to an illustrative implementation.

In some implementations, the material can be selected to have a level of cytotoxicity below a predetermined threshold to provide viability of the biological sample within the microfluidic device. For example, the level of cytotoxicity may depend in part on the type of biological material that is to form the biological sample within the microfluidic device. In some implementations, the material is selected to have a level of cytotoxicity permitting at least about 90% of cells included in a biological sample to survive over a period of at least one week in the microfluidic device. In some implementations, non-cytotoxic material means the viability of cells cultured in a microfluidic device made from such material is not statistically significantly different from cells cultured in a microfluidic device made from a material known to be non-cytotoxic. In some implementations, the material can also be selected to provide the minimum level of cytotoxicity for the biological sample in the presence of one or more drugs or medications that may also be introduced into the microfluidic device. For example, a drug or medication may be used to treat the biological sample before it is introduced into the microfluidic device, or may be flowed through the microfluidic device after the biological sample has been introduced. In some embodiments, the material can also be selected to provide a relatively low rate of sorption of the drug or medication to be introduced into the microfluidic device. For example, a low sorption rate may facilitate more precise control over the concentration of the drug or medication within the microfluidic device over time. The biological sample may include any type or form of biological material, such as a tissue fragment, a tumor fragment, a cultured organoid, an immune cell, a mammalian cell, or a human T-lymphocyte. In some implementations, the material can be selected to have a level of cytotoxicity in the range of any of the materials shown and described in connection with FIG. 7.

Many materials may be useful to produce the devices, or molds to make devices, including polyetheretherketone ("PEEK"), polymethylacrylamide or polymethacryalmide, or biodegradable polymers such as polyvinylalcohol, polycaprolactone and polylactide. The preferred material is transparent (which excludes PEEK). In some embodiments, a material, described in the example, for photopolymerization to make a non-toxic microfluidic device is marketed as Pro3dure G10 (Pro3dure Medical GmbH, Dortmund, Germany). This material is described in EP 3209265 as including at least a polyethyl methacrylate polymer (PEMA) or a polyethyl methacrylate-polymethyl methacrylate copolymer (PEMA-PMMA). More broadly, the material includes at least 50%, or 60% and or 70% based on the weight of polyethyl methacrylate polymer or copolymer. At least 90% or at least 95% by mass of the polymeric material is polyethyl methacrylate polymer or polyethyl methacrylate copolymer, and a second monomer in which the polyalkyl methacrylate polymer is at least partially soluble, such as an alkyl acrylate and/or an alkyl methacrylate monomer, for example, the alkyl acrylate and/or alkyl methacry late monomer is a monomer of methacry late group methyl methacry late, ethyl methacrylate, ethyl acrylate, ethoxyethyl acrylate, tetrahydrofurfuryl methacrylate, tetrahydrofurfuryl acrylate, isobornyl acrylate and/or isobornyl methacrylate and preferably ethoxyethyl methacrylate. This polymeric material can further include a flexibilizer, and/or a catalyst, in particular an organic peroxide such as benzoyl peroxide and/or toluidine, or barbituric acid or a barbituric acid derivative, wherein the catalyst is in some embodiments in a concentration of 0.25-1 percent by mass. Representative flexibilizers include citric acid based, the adipic acid, the phthalic acid or aliphatic esters, particularly in some embodiments 1,2-cyclohexanedicarboxylic acid-diisononyl esters.

The selected material can be a methacrylate resin such as the Pro3dure GR-10 material described above. The selected material can include a poly(alkyl methacrylate) polymer. The poly(alkyl methacrylate) polymer can be any type of polymer in which the monomers are an alkyl methacrylate. In some implementations, a second component of the selected material can include at least one alkyl acrylate monomer and/or on alkyl methacrylate monomer. In some implementations, the second component can include two or more alkyl acrylate monomers and/or on alkyl methacrylate monomers.

In some implementations, the first component of the selected material can include at least one poly(ethyl methacrylate) polymer (PEMA) or poly(ethyl methacrylate)-poly (methyl methacrylate) copolymer (PEMA-PMMA). For example, the first component of the selected material can include at least one PEMA powder or PEMA copolymer powder. The first component of the selected material also can include other polymer powders such as PMMA poly (methyl methacrylate) in combination with the PEMA polymer powder. In some implementations, the first component of the selected material can be made of up to at least 90% or up to at least 95% with respect to the mass of component A of poly (ethyl methacrylate) polymer or poly (ethyl methacrylate) copolymer. In some implementations, the mass fraction of the polymer powder made of poly (ethyl methacrylate) polymer or poly (ethyl methacrylate) poly (methyl methacrylat) copolymer can be at least 25%, at least 45%, or at least 50% of the total mass of the selected material.

In some implementations, the first component of the selected material can include a catalyst. For example, the first component of the selected material can include organic peroxide like benzoyl peroxide and/or toluidine, or barbituric acid or respectively a barbituric acid derivate. The catalyst can be present in a concentration of 0.25-1 percent by weight. The admixing of a catalyst can improve in an advantageous manner the polymerization capability of the monomers contained in the second component of the selected material. In some implementations, the catalyst used in the selected material can belong to the group of barbituric acids and their derivatives. For example, the following substances can be used as catalysts: barbituric acid, 1,3-dimethylbarbituric acid, 1,3-diphenylbarbituric acid, 1,5-dimethylbarbituric acid, 5-butylbarbituric acid, 5-ethylbarbituric acid, 5-isopropylbarbituric acid, 5-cyclohexylbarbituric acid, 1,3,5-trimethylbarbituric acid, 1,3-dimethyl-5-ethylbarbituric acid, 1,3-dimethyl-n-butylbarbituric acid, 1,3-dimethyl-5-isobutylbarbituric acid, 1,3-dimethyl-5-tertbutylbarbituric acid, 1,3-dimethyl-5-cyclopentylbarbituric acid, 1,3-dimethyl-5-cyclohexylbarbituric acid, 1,3-dimethyl-5-phenylbarbituric acid, 1-cyclohexyl-5-ethylbarbituric acid, 1-benzyl-5-phenylbarbituric acid and thiobarbituric acids as well as their salts.

In some implementations, the alkyl acrylate and/or alkyl methacrylate monomer of the second component of the selected material can be at least one monomer of the group methyl methacrylate, ethyl methacrylate, ethyl acrylate, ethoxyethyl acrylate, tetrahydrofurfuryl methacrylate, tetrahydrofurfuryl acrylate, isobornyl acrylate and/or isobornyl methacrylate and/or ethoxyethyl methacrylate. It should be understood that this list is illustrative only and is not intended to be interpreted as limiting. For example, such monomers can also be used in combination and/or formulated with other compounds from acrylates or methacrylates, including for example, bisphenol-A-ethoxylate(2)dimethacrylate, bisphenol-A-ethoxylate(4)dimethacrylate, bisphenol-A-propoxylate(2)dimethacrylate, bisphenol-A-propoxylate(4)dimethacrylate as well as dimethacrylates of the (n)-alkoxylized bisphenol F like bisphenol-F-ethoxylate(2) dimethacrylate and bisphenol-F-ethoxylate(4)dimethacrylate, bisphenol-F-propoxylate(2)dimethacrylate, bisphenol-F-propoxylate(4)dimethacrylate and mixtures of these. In some implementations, monomeric or oligomeric dimethacrylates based on bisphenol A, in particular the bisphenol-A-ethoxylate(2)dimethacrylate and the bisphenol-A-ethoxylate(4)dimethacrylate, can be used.

In some implementations, the selected material also can include a flexibilizer, such as a citric-acid-based, adipic-acid-based, phthalic-acid-based, or aliphatic ester. In some implementations, the flexibilizer can be selected from phthalic acid esters such as diethylhexylphthalate (DEHP), aliphatic esters, alkylsulfonic acid esters of phenol, citric-acid-based flexibilizers such as citric acid triethyl ester or 1,2-cyclohexane dicarboxylic acid diisononyl ester, or adipic-acid-based flexibilizers like diethylhexyladipate or diethyloctyladipate.

In one example, the first component of the selected material can include poly(ethyl methacrylate) and 1-benzyl-5-phenylbarbituric acid. The poly(ethyl methacrylate) can make up about 99% of the mass of the first component, and the 1-benzyl-5-phenylbarbituric acid can make up about 1% of the mass of the first component. The second component can include ethoxyethyl methacrylate; tetrahydrofurfuryl methacrylate; 1,2-cyclohexane dicarboxylic acid diisononyl ester; dilauryl dimethyl ammonium chloride; and 1% copper (II)-acetylacetonate solution in MMA. The ethoxyethyl methacrylate can make up about 49.73 percent of the mass of the second component, the tetrahydrofurfuryl methacrylate can make up about 33.2% of the mass of the second component, the 1,2-cyclohexane dicarboxylic acid diisononyl ester can make up about 16.5% of the mass of the second component, the dilauryl dimethyl ammonium chloride can make up about 0.4% of the mass of the second component, and the 1% copper(II)-acetylacetonate solution in MMA can make up about 0.17% of the mass of the second component. The first component and the second component can be mixed in a ratio of 100:75 (first component:second component).

In some embodiments, materials are photocurable.

III. EXAMPLE

The following non-limiting example demonstrates how to identify printable materials for use with associated manufacturing technologies to produce microfluidic devices having the desired properties.

A. Materials and Methods

Selection of Printable Material with Associated AM Method

A set of printable materials processed via stereolithography (SLA), Digital Light Projection Stereolithography (DLP-SLA), and PolyJet manufacturing methods were tested. The DLP-SLA prints were made with a Pico Plus 27 (Asiga, Sidney, Australia), the SLA prints were made with a Viper (3D Systems, Valencia, Calif., USA), and the PolyJet prints were made with a Objet1000 Plus® printer (Stratasys, Eden Prairie Minn., USA). All printable materials tested were liquid resins with associated printing processes that harness photopolymerization to create solid objects. The printable materials tested included PlasCLEAR (Asiga, Sidney, Australia), Watershed XC11122 (DSM Functional Materials, Somos® Material Group, Elgin Ill., USA), Pro3dure G10 (Pro3dure Medical GmbH, Dortmund, Germany), and MED 610 (Stratasys, Eden Prairie Minn., USA). Pro3dure GR-10 is a methacrylate-based resin that is intended for manufacturing implant and bite splints. DLP-SLA printable resin Pro3dure GR-10 was selected as the constitutive material for the TAP devices.

Convex Feature Resolution Characterization

High-resolution fabrication can be useful for the successful implementation of finely featured microfluidics. The printing resolution of each material tested was characterized using a resolution matrix, i.e., an array of features that systematically covers a range of one or more parameters of the morphology of the feature (subsets of features within a resolution matrix, with one or more nominally identical parameters, are intended to characterize the repeatability of the fabrication method). In these experiments, each resolution matrix consisted of an array of straight cylindrical pillars spanning specified ranges of diameter and height. For highest fidelity between prints and CAD files, the nominal diameters of the cylindrical pillars (i.e., in the CAD files) were multiples of the pixelation/spot size of the printing method; the DLP-SLA printer had 30.3 µm pixels, the PolyJet printer had 43.2 µm pixels (both pixel sizes were estimated from preliminary printing experiments), and the SLA printer had a 127 µm laser spot size (from the printer documentation). For the DLP-SLA and PolyJet prints, the nominal diameters were equal to 6, 7, 8, 9, 10, 12, 15, and 20 pixels; even though commercial DLP-SLA printers are capable of printing features with as little as 3 pixels (~75 µm), such small features are obtained with high-resolution, opaque resins that are incompatible with various application. For the SLA prints, the nominal diameters were equal to 1, 2, 3, 4, 5, 6, 7 and 8 laser spot sizes. Similarly, the nominal heights of the pillars were multiples of the slicing height (25 µm for all printers) and equal to 250 µm, 500 µm, 750 µm, and 1000 µm.

The resolution matrices were measured with a scanning white light interferometer VR-3100 3-D Measurement System (Keyence, Itasca Ill., USA) using the VR-3000 series software. Characterization of each resin tested included evaluation of the similarity between printed and CAD dimensions, assessment of the linearity of the dimensional scaling, and estimation of the minimum in-plane feature size; the summary of the metrology of the different printable materials characterized is shown in Table 1 below. The metrology data show Pro3dure GR-10 and WaterShed XC 11122 as the best-performing resins of the set: for example, using the DLP-SLA material PlasCLEAR results in diameters 20% larger than the ideal 1-to-1 correspondence with CAD values—a fivefold larger offset compared to the other resins; also, the smallest diameter resolved by the PolyJet material MED 610 is about a threefold larger than the minimum features made via SLA or DLP-SLA—pointing out potential challenges when attempting to create designs with fine features with such material. For Watershed XC 11122 (i) there is linearity between the nominal and printed diameters across the examined range with a slope 2% off the ideal 1-to-1 correspondence; (ii) on average, there is very little offset between the diameter of the printed part and the CAD model (~3.5 µm); (iii) the narrowest printed pillars had a nominal diameter equal to 127 µm, corresponding to a printed diameter equal to 92.2±7.8 µm; and (iv) the printed height vs. nominal height of the pillars is also linear, with a slope 7% off from the ideal 1-to-1 correspondence and a submicron offset. For Pro3dure GR-10 (i) the nominal and printed diameters are linear across the range investigated, with a slope 4% off the ideal 1-to-1 correspondence; (ii)

there is an average offset on the order of one pixel between the printed diameter of the and the diameter of the CAD model; (iii) the narrowest printed pillar had a nominal diameter equal to 181.5 µm, corresponding to a printed diameter equal to 134.4±6.3 µm; and (iv) the printed height vs. nominal height of the pillars is also linear, with a slope 10% off the ideal 1-to-1 correspondence and an offset on the order of two slices (60 µm). Even though the smallest diameter resolved by the material Pro3dure GR-10 is ~50% larger than the smallest diameters resolved by the materials PlasCLEAR and Watershed XC 11122, the variation of the Pro3dure GR-10 feature is smaller in both absolute and relative terms, which should translate into more repeatable fabrication. For Pro3dure GR-10 and WaterShed XC 11122, variation in aspect ratio of the pillar features had minor effects on the accuracy of the post heights.

BLUE® cell viability reagent, cell viability was assessed at three points in time, i.e., immediately after seeding, at 24 hours of incubation, and at 48 hours of incubation. Wells of cell media, without cells, and reagent were incorporated into the assay to act as blanks. Assay wells were mixed thoroughly, and the cells and reagent incubated for one hour at a temperature of 37° C. A SPECTRAMAX M2 microplate reader (Molecular Devices, Sunnyvale Calif., USA) measured the fluorescence levels of the assay wells at an excitation of 560 nm and an emission of 590 nm. Fluorescence values for the media-only treatment group were averaged and subtracted from the fluorescence readings obtained from the remaining treatment groups (i.e., the four resins and the positive control). The blank-corrected values were then averaged across each treatment group. The reported values were normalized to the blank-corrected

TABLE 1

Printing technology, least-squares linear fit of printed diameter as a function of CAD diameter, minimum printed diameter, and least-squares linear fit of printed height as a function of CAD height for the set of down-selected printable materials. In the linear fits PD = printed diameter, CD = CAD diameter, PH = printed height, and CH = CAD height. Each nominal height value was used in 16 different pillars of each resolution matrix, while each nominal diameter value was used in 8 different pillars of each resolution matrix.

| Material | Printing Technology | Linear Fit Pillar Diameter (µm) | Smallest Printed Pillar Diameter (µm) | Linear Fit Pillar Height (µm) |
|---|---|---|---|---|
| PlasCLEAR | DLP-SLA | $PD = 1.20 \cdot CD - 198$, $R^2 = 0.97$ | 90.5 ± 14.5 (16%) | $PH = 0.983 \cdot CH - 66.0$, $R^2 = 0.84$ |
| WaterShed XC 11122 | SLA | $PD = 0.978 \cdot CD + 3.39$, $R^2 = 0.99$ | 92.2 ± 7.8 (8.5%) | $PH = 0.934 \cdot CH + 0.239$, $R^2 = 0.99$ |
| Pro3dure GR-10 | DLP-SLA | $PD = 1.04 \cdot CD - 40.9$, $R^2 = 0.99$ | 134.4 ± 6.3 (4.7%) | $PH = 0.899 \cdot CH + 59.6$, $R^2 = 0.98$ |
| MED610 | PolyJet | $PD = 0.990 \cdot CD + 53.4$, $R^2 = 0.99$ | 307.7 ± 10.9 (3.5%) | $PH = 0.881 \cdot CH + 53.4$, $R^2 = 0.94$ |

Cellular Compatibility

Cytotoxicity testing was performed on the four printable materials initially down-selected for the TAP device. Long-term viability of cells in contact with the material is required for the intended tumor analysis application because extended exposure of cellular material to the printed material is expected. However, the literature suggests that any purportedly printable biocompatible materials exhibit varied degrees of cytotoxicity in vitro. Furthermore, most photopolymerizable materials that are reportedly biocompatible exhibit obvious declines in biocompatibility by the 48-hour mark. During these experiments, viability of cells was monitored during 48-hour exposure to each of the evaluated materials. Based on the data, Pro3dure GR-10, i.e., the material of the set that performed most similarly to the positive control, was selected for an extended 96-hour cytotoxicity test, which confirmed the remarkable cellular compatibility of the resin.

Figure 3:
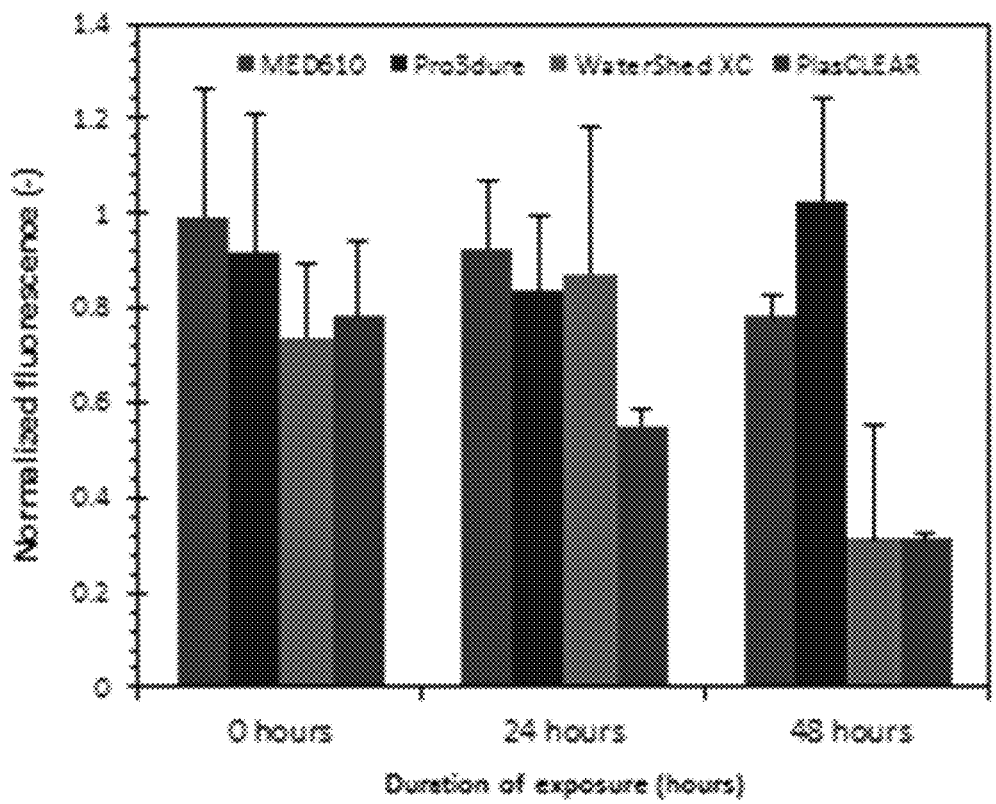
FIG. 3 is a graph showing cell viability fluorescence vs. duration of cellular exposure to printed samples for a variety of materials, according to an illustrative implementation.

The samples used in these experiments were 6 mm by 6 mm by 2 mm printed tiles. Prior to cell exposure, samples were soaked in a 70% v Ethanol and 5% v Isopropanol solution (base is distilled water) for 30 minutes at room temperature. Samples were then rinsed five times with distilled water, transferred to clean wells in a 24-well Falcon well-plate (Corning, Inc., Corning N.Y., USA), and subjected to a final rinse in phosphate buffered saline (PBS). Jurkat immortalized human T-lymphocytes (grown in Roswell Park Memorial Institute with 10% fetal bovine serum (FBS) and 1:100 penicillin/streptomycin medium) were seeded into wells containing sample tiles (n=3 samples in total for each resin, 1 per well), or, in the case of the positive control (cells grown on tissue culture polystyrene—TCPS), no tile (n=3 wells in total) at a density of 250,000 cells/mL, 1 mL per well. The samples were incubated at a temperature of 37° C. for 48 hours. Using the PRESTO-TCPS average for the respective day. The results are shown in FIG. 3, showing cell viability fluorescence vs. duration of cellular exposure to printed samples for a variety of materials, according to an illustrative implementation, and FIG. 4, cell viability fluorescence versus duration of cellular exposure to printed samples for Pro3dure GR-10 of an extended period of time, according to an illustrative implementation.

Figure 4:
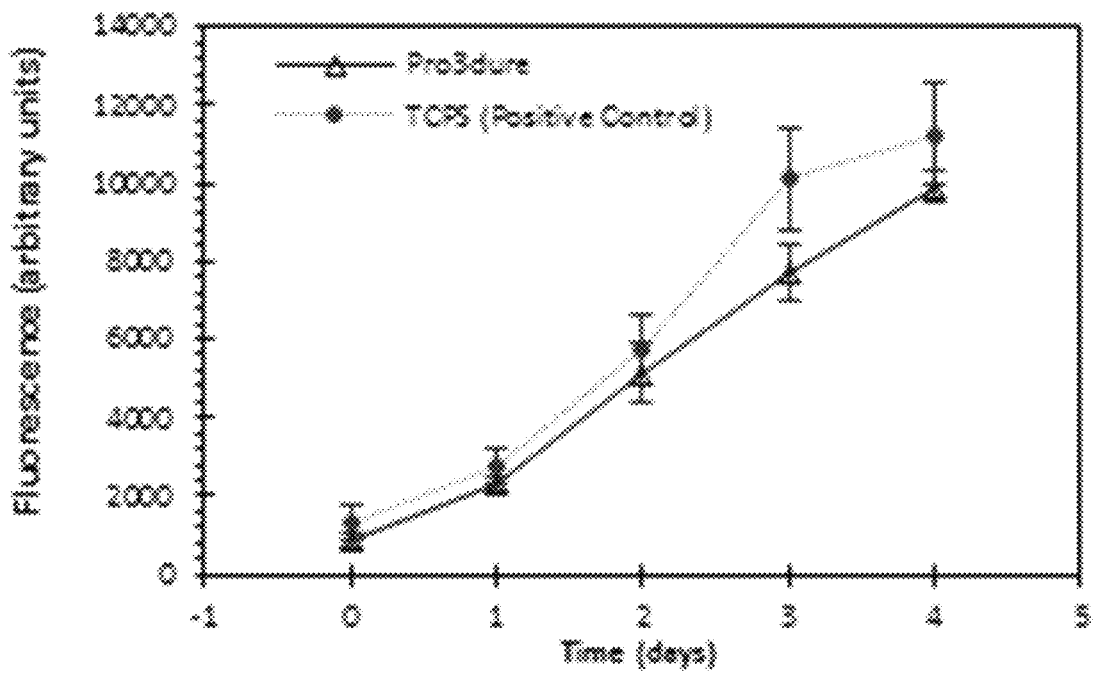
FIG. 4 is a graph of cell viability fluorescence vs. duration of cellular exposure to printed samples for Pro3dure GR-10 of an extended period of time, according to an illustrative implementation.
Figure 5:
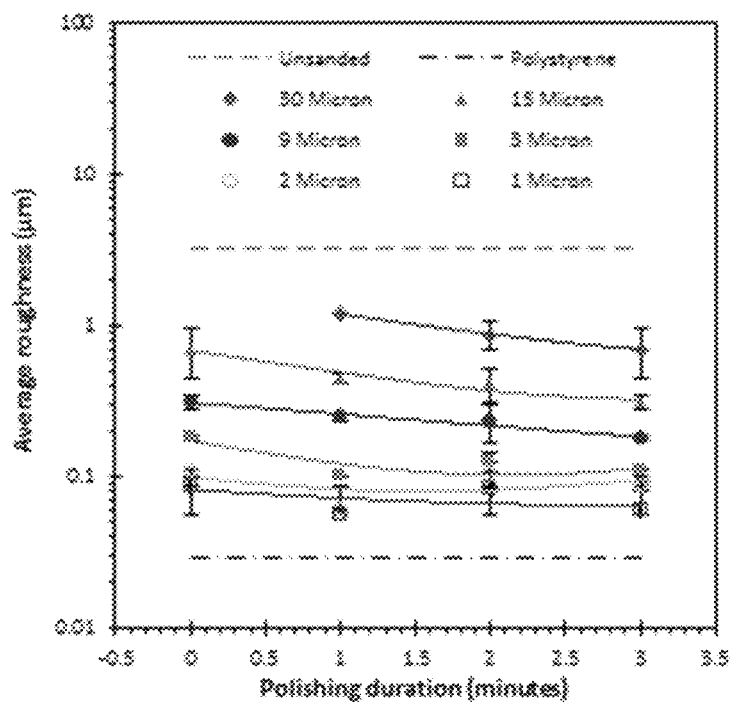
FIG. 5 is a graph showing surface roughness of printed parts vs polishing time for various sandpaper grit sizes, according to an illustrative implementation.

The majority of materials tested induced some degree of decline in cell viability over the duration of the test. The MED 610, Watershed XC11122, and PlasCLEAR materials demonstrated varied degrees of decline in cell viability over the 48-hour test period. However, cells exposed to Pro3dure GR-10 exhibited no decline in cell viability relative to the positive control. The extended viability study for Pro3dure GR-10 reaffirmed the findings of the short-term cytotoxicity study, as shown in FIG. 4. The viability of Jurkat human T-lymphocytes exposed to Pro3dure GR-10 was not significantly different than the positive control of cells grown in TCPS after 96 hours of exposure to the material. A two-tailed Student's t-test with unequal variance performed at a confidence-level of $\alpha=0.05$ could not reject the null hypothesis that the two groups had equal means (P=0.08 for Day 4). In some implementations, Pro3dure GR-10 or another material may be selected based on having level of cytotoxicity within a predetermined threshold to provide viability of the biological sample within the microfluidic device to provide survival of at least 90% of cells included in the biological sample over a period of at least one week. In some implementations, the biological sample may include human T-lymphocytes, as described above. In other implementations, the biological sample may include a tissue fragment or a cultured organoid or spheroid.

The conclusion of the cytotoxicity and convex feature resolution experiments is that, in some implementations, Pro3dure GR-10 can be the best material of the examined set for creating microfluidic devices intended for biomedical applications. For example, although WaterShed XC 11122 can resolve finer features than Pro3dure GR-10 and printed parts made in this resin have closer resemblance to the CAD file, WaterShed XC 11122 exhibits cytotoxicity. Also, even though MED610 has comparable biocompatibility to that of Pro3dure GR-10, its feature resolution is not as good. Moreover, MED610 is printed via PolyJet, i.e., it creates channels filled-in with solidified support material, which significantly complicates the post-processing (channel unclogging) of a complex microfluidic device. Therefore, the remaining characterization conducted on the printable feedstock (i.e., channel resolution, transparency, and fluorescence) focused on the Pro3dure GR-10 resin.

Microchannel Resolution Characterization

Understanding the limitations of fabrication technology can be integral to the effective design and construction of 3D printed microfluidics. In some implementations, microscale channels and voids, rather than microscale extrusions, are perhaps the more useful attributes of microfluidic devices. Channel fabrication capabilities can widely vary depending on the 3D printing method and material; the smallest dimensions of resolvable channels ultimately can govern the design of the microfluidic device. Therefore, a full factorial design of experiments (DOE) was conducted for Pro3dure GR-10 to investigate how certain printing parameters affect the dimensions of microfluidic channels, as well as how these dimensions compare to those of the input CAD file, with the goal of optimizing the printing process and understand limitations of the fabrication method.

The Asiga Pico Plus 27 used to print Pro3dure GR-10 as described in this disclosure is a DLP-SLA system in which the build platform is drawn upward from a vat of resin as the part is fabricated layer by layer. The extent of curing in a build is governed in part by the intensity of the printer's UV light source, the duration of UV exposure, and the absorbance characteristics of the photopolymer resin. The creation of microchannels requires precise control of the curing process because over-exposure of the resin to UV light can result in unwanted constriction of channels and voids. Over-curing is defined as the curing of resin beyond the CAD dimensions due to the bleeding of light into the adjacent resin. In some implementations, minor over-curing is useful to achieve adhesion between printed layers; however, substantial over-curing may lead to prints that unpredictably stray from the CAD model. Two adjustable parameters of the 3D printing job can significantly affect the extent of curing within a build, i.e., layer thickness and curing thickness offset. The layer thickness is defined as the incremental distance that the platform moves vertically with each layer of the build; as each layer is cured, the thickness of the polymerized layer extends beyond the assigned layer thickness and partially into the already solidified material to ensure that the new layer and previous layers are firmly bonded to one another. The curing offset is the distance that this polymerized layer theoretically extends beyond the assigned layer thickness. The curing offset can be directly adjusted within the printer software; alterations to this dimension translate into modified exposure times.

Layer thickness and curing thickness offset were incorporated into a DOE in order to investigate their combined effects on the extent of over-curing in a build. Curing offset levels were selected based on a suggested range provided by the manufacturer of the printer (i.e., 60 μm, 80 μm, and 100 μm). Test levels for layer thicknesses were restricted to available printer settings within a practical resolution range for desired microfluidic features (i.e., 50 μm, 100 μm, and 150 μm). In some implementations, different layer thicknesses can be selected. For example, layer thicknesses in the range of about 0.03 millimeters to about 0.2 millimeters can be selected. In some other implementations, layer thicknesses in the range of about 0.05 millimeters to about 0.15 millimeters can be selected. Over-curing in the build direction (i.e., out-of-plane) was found to be significantly dependent upon the layer offset and curing thickness ($P<0.05$). The extent of over-curing tended to decrease with increasing layer thickness and decreasing curing offset. Based on the trends observed, a combination of a 100 μm layer thickness and 40 μm curing offset were selected for microfluidic fabrication and found to produce repeatable prints with good adhesion between layers and manageable over-curing; larger layer thicknesses can lead to reduced over-curing, but may increase likelihood of build failure. In some implementations, different curing thickness offsets may be selected. For example, the curing thickness can be in the range of about 0.3 millimeters to about 0.1 millimeters in some implementations.

Analysis of variance indicates that neither of the two input parameters nor their interaction effects contributed significantly to the over-cure values in the plane perpendicular to the build direction. Rather, a constant over-curing was seen at all variations of the tested variables ($P<0.05$). This result suggests that in-plane over-curing may be attributable to the absorbance properties of the resin. A transparent resin, like the Pro3dure GR-10, can be prone to noticeable transmission of UV light in the planar directions as each layer of the part is cured. Based on the presented findings, elimination of unwanted over-curing is impractical and may be impossible with a resin with such absorption properties. Instead, characterization of over-curing properties at various print settings can enable proper compensation in device design for more predictable and accurate builds.

Minimum channel cross-sectional area is constrained by the printer and post-processing capabilities: channel cross-sections must be sufficiently large that they resolve successfully during printing, and excess resin can be removed from within the channels during post-processing. At the selected printing parameters, series of rectangular channels were printed with assorted heights and widths to determine the limits of channel resolution. The findings of these prints are summarized in Table 2 below. The minimum printed channel cross-sectional area equated to a theoretical value of 0.50 $mm^2$; it should be noted that the reported channel widths and heights in Table 2 are the CAD dimensions and not the actual printed dimensions, which are smaller. The narrowest of the channels used in the TAP device had a CAD width of 395 μm, while the width of the corresponding printed channels measured approximately 354 μm, i.e., a reduction of more than 40 μm (about one pixel), matching the average offset found in the linear fit from the data of the metrology of the convex features.

TABLE 2

Cross-sectional area for a range of CAD channel widths and heights. Channels that could be completely cleared after printing are shown in bold font, while channels that did not successfully resolve (i.e., clogged) are shown in standard font.
Assigned channel cross-sectional area ($mm^2$)

|  |  | CAD channel width (mm) | | | | | | |
| --- | --- | --- | --- | --- | --- | --- | --- | --- |
|  |  | 1.50 | 1.25 | 1.00 | 0.75 | 0.60 | 0.50 | 0.40 |
| CAD channel height (mm) | 2.25 | 3.38 | 2.81 | 2.25 | 1.69 | 1.35 | 1.13 | 0.90 |
|  | 2.00 | 3.00 | 2.50 | 2.00 | 1.50 | 1.20 | 1.00 | 0.80 |
|  | 1.75 | 2.63 | 2.19 | 1.75 | 1.31 | 1.05 | 0.88 | 0.70 |
|  | 1.50 | 2.25 | 1.88 | 1.50 | 1.13 | 0.90 | 0.75 | 0.60 |
|  | 1.00 | 1.50 | 1.25 | 1.00 | 0.75 | 0.60 | 0.50 | 0.40 |
|  | 0.75 | 1.13 | 0.94 | 0.75 | 0.56 | 0.45 | 0.38 | 0.30 |
|  | 0.50 | 0.75 | 0.63 | 0.50 | 0.38 | 0.30 | 0.25 | 0.20 |

Optical Characterization

Similar to many biomedical microfluidics, imaging of the dynamics at the interior of the TAP device can be useful, e.g., to verify tumor uploading, to capture fluorescent images of intra-channel cell aggregates. An ideal printable material compatible with external optical interrogation can be transparent to visible light (390 nm-700 nm) and can have low auto-fluorescence.

In some implementations, the bottom surface of the objects made with a SLA-DLP printer can be too rough to permit adequate imaging of the device's internal contents without additional modification of the surface; the roughness can result from the direct contact of the base of the printed part with the textured surface of the build platform, which can help to ensure adequate adhesion of the object during printing. Multiple surface treatments were explored, including application of a thin layer of clear nitrocellulose coating. Although the coating markedly improved visualization through printed surfaces, the resulting resolution was insufficient for the desired application. Polishing of the device bottom surface was found to produce superior results, enabling the visualisation of single cells within the device channels. Surface polishing was conducted in six stages and characterized using profilometry. The platform-facing side of unpolished printed parts had an average roughness equal to 3.16±0.095 μm, while the average roughness of a polystyrene culture dish used as target was estimated at 29±21 nm. Printed parts were polished making small-radius circular movements with a constant applied force and rotation frequency for durations equal to 1, 2, or 3 minutes. A Form Talysurf PGI profilometer (Taylor Hobson, Leicester, UK) measured average roughness (n=2) of the polished surfaces at these assigned durations for each of the six grades of 3M Micron Graded Wet/Dry polishing paper: 30 μm, 15 μm, 9 μm, 3 μm, 2 μm, and 1 μm (ZONA, Bethel Conn., USA). The results are shown in FIG. 4, which is a chart 400 showing surface roughness of printed parts vs polishing time for various sandpaper grit sizes, according to an illustrative implementation. The average roughness of the sanded surfaces was reduced to 59 nm±14 nm, i.e., three orders of magnitude smoother and of the same order of magnitude as the surface roughness of the polystyrene target.

The absorbance of printed samples was measured for wavelengths ranging from 350 to 750 nm in 10-nm increments using a SpectraMax M2 plate reader (Molecular Devices, Sunnyvale Calif., USA) to verify adequate transparency of the resin Pro3dure GR-10. The absorbance can be defined as $$A = \log\left(\frac{I_0}{I}\right) \tag{1}$$

where I is the intensity of the light transmitted by the sample and $I_o$ is the original light intensity. Printed chips were sized to fit snugly at the bottom of a Falcon 96-well plate with heights equal to 500 μm, 1000 μm, or 2000 μm. The platform-facing side of half of the disks (i.e., three samples for each height) were polished as previously described. Samples were first cleaned in distilled water and placed into a Falcon 96-well plate with 250 μL of distilled water. Two additional wells, without any printed disks, were filled with 250 μL of water to act as blanks. Absorbance measurements for the blanks were averaged and subtracted from the sample measurements for the respective wavelengths. From these measurements, the absorbance of the printed objects can be estimated. Polished samples exhibited reduced absorbance values for all sample thicknesses. Absorbance readings are high at shorter wavelengths, but reach minimum values at approximately 420 nm (blue light) and remain relatively constant up to 750 nm. Therefore, the resin Pro3dure GR-10 can be transparent across most of the visible spectrum, with the exception of the near-UV wavelengths. The DLP-SLA printer uses an array of 405 nm diodes to expose the printable resin. From the absorbance data, the transmittance T can be calculated given that $$T = \left(\frac{I}{I_0}\right) \tag{2}$$

i.e.

$$T = 10^{-A} \tag{3}$$

Figure 6:
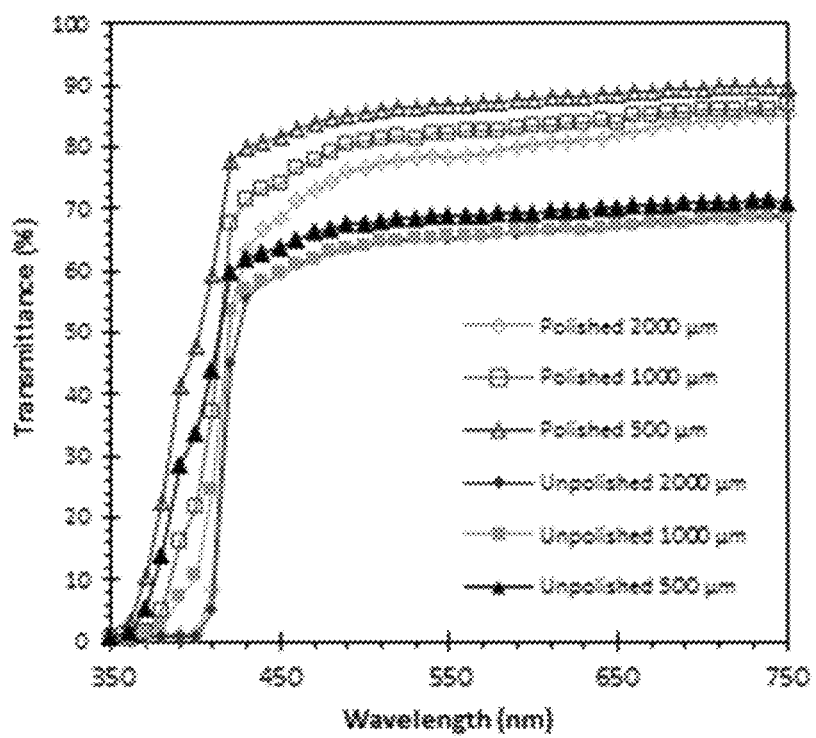
FIG. 6 is a graph showing transmittance vs. light wavelength for 3D-printed Pro3dure cylinders of various thicknesses and surface finishes, according to an illustrative implementation.

The net effect of polishing the surface of the printed objects can be a 12% to 19% increase in the transmittance for wavelengths above 500 nm as shown in FIG. 6, which is a chart showing transmittance versus, light wavelength for 3D-printed Pro3dure cylinders of various thicknesses and surface finishes, according to an illustrative implementation. The measured transmittance of the polished 500 μm thick samples is above 80% for visible light, plateauing at approximately 90%. In some implementations, microfluidic devices fabricated from PDMS can be deemed optically acceptable for microscopy when transmission reaches 80%. In the TAP device, images are captured through 300 μm to 500 μm-thick polished printed walls.

The non-fluorescence characteristics of Pro3dure GR-10 can be sufficient for the visualization requirements of various application, i.e., resolution of a single cell on the order of 10 μm in size, or of fluorescent markers of single cells (e.g., Fluospheres), such that viability or identity of the biological sample can be achieved, as illustrated by FIG. 4.

Device Design

The TAP device consolidates multiple functional components into a single 14 mm×24 mm×38 mm monolithic chip. During operation of the TAP device, incoming media, fluorescent markers, and treated/untreated lymphocytes flow past a bubble evacuation chamber, where unwanted air is removed from the system. The fluid solution is then routed towards a tumour biopsy fragment secured inside a tumour-trapping pocket. Multiple flow paths permit lymphocytes to flow within close contact of the tumour sample; if activated, the immune cells can bind to the cancerous tissue. Threaded connectors at the inlet and outlet ports provide a means to securely attach fluid lines with an airtight seal using commercially available microfluidic fittings (IDEX Health & Science LLC, Oak Harbor Wash., USA).

Microfluidic Channel Architecture.

Channel specifications can be guided by design requirements and can be constrained by fabrication limitations: for example, in some implementations, a primary (i.e., inlet) channel that transports a tumor to a tumor pocket can be sufficiently large to prevent channel clogging by tumor samples. However, branched (i.e., outlet) channels downstream of the tumor pocket can be small enough so tumor fragments are dependably trapped and cannot pass through to the device outlet. Ultimately, the minimum channel dimensions can be dictated by printer and post-processing capabilities. In some implementations, channel cross-sections can be sufficiently large to permit successful resolution during printing and removal of uncured resin from within channels during post-processing. Dimensions can be chosen to simultaneously retain a tumor fragment within the device, while achieving a large enough cross-sectional area to permit removal of uncured resin from the channels. To achieve both objectives, rectangular cross-section channels (heights larger than widths), with or without filleted corners, can be utilized in the design. In some implementations, rounded corners can decrease the surface area-to-volume ratio of the channel compared to a rectangular channel with sharp corners, reducing the hydraulic resistance of the channels without producing the image distortion that arises in channels with circular cross-section. In addition, the filleted shape can mitigate stagnation of fluid and cells in the regions near the corners. Outlet channels can be sized such that tumor fragments larger than 350 µm in diameter cannot pass through.

In some embodiments, the resistance value for the resistance component of the illustrative tumor model circuit may be calculated as follows:

Circular Cross Section Solve for Resistance:

ID [m]=1.27E-04

Length [m]=1.143

Fluid Dynamic Viscosity [N*s/m^2]=1.00E-03

Resistance [N*s/m^5] 1.79E+14

For sample visualisation purposes, channel positioning within the device can account for the dependence of light transmission on material thickness. For high image quality, channel walls through which samples are imaged can be constructed as thin as possible without risking compromised structural integrity. In the TAP device, samples can be imaged through the bottom surface of the device. As such, in some implementations, the bottom channel walls can be positioned 500 µm or less from the base of the chip to allow for improved imaging of internal contents using an inverted microscope. Within the tumor-trapping zone (where image quality is most useful) the bottom wall of the tumor pocket is only 300 µm from the base of the chip.

Tumour-Trapping Zone.

The tumour-trapping zone sits at the intersection of the primary inlet channel and the four smaller, diverging outlet channels; when properly trapped, the tumour resides in a sunken pocket at the aforementioned intersection. The elevation change between the pocket and surrounding channels aims to prevent releasing the tumour in the event of back-flow. The tumour pocket is constructed to be large enough for sizable tumour fragments to sit fully within the cavity and small enough that tumour-infiltrating lymphocytes (TILs) flowing past the tumour are likely to have their flow path disrupted by the biopsy fragment. The pocket makes the positioning of the tumour fragment straightforward and consistent, facilitating its imaging.

Bubble Trap.

Bubbles can be inadvertently introduced to the chip during the tumour loading process, or via the incoming flow of media and lymphocytes. Bubbles can adversely impact experimental results and should be prevented from entering the system. Incorporation of a bubble trap into the design allows for easy removal of gas introduced by either mechanism. An in-line bubble trap eliminates the need for an external air removal device, reducing the number of required connections and the risk of unwanted trapping of circulating TILs at these connector sites. Additionally, inclusion of the bubble trap within the device reduces overall fluid volume requirements.

The bubble trap is designed to cause limited disruption of the primary flow path and positioned such that bubbles introduced via the device inlet can be passively removed prior to reaching the tumour site. The vertical cross-section of the bubble trap is a parabolic "chimney" that facilitates removal of bubbles from the flow via gravity. The bubble trap ends in a threaded port that connects to a syringe, allowing evacuation of gas from the top of the chimney as needed.

Tumour Loading.

Tumour fragments are introduced into the device with a micropipette via the bubble evacuation port of the bubble trap—this way, any bubbles introduced during the loading process can be readily evacuated. Once the tumour has been placed in the primary channel, the bubble trap is reconnected to the air relief syringe. Initiation of flow through the device inlet drives the tumour through the channel and into the tumour pocket, where the sample remains for the duration of the experiment.

Device Fabrication

The TAP devices were fabricated with an Asiga Pico Plus 27 DLP-SLA printer using Pro3dure GR-10 resin. Surface treatment of the bottom chip surface can result in adequate optical characteristics of the device for imaging. The printer can be contained within a table-top cleanroom environment with HEPA filtering. To print a device, first, CAD models can be developed, for example in SolidWorks 2016, and saved as STL files. Next, using the Asiga Composer software, the CAD models can be oriented such that the base of the part is flush with the build platform. Print settings can be adjusted to a layer thickness of around 100 µm and curing offset value of around 40 µm. The Composer software can generate a file that is transferred to the printer and that can be run untethered from the computer. The object can then be printed, layer by layer: the entirety of each layer can cure simultaneously when a patterned array of pixels directs UV light onto a thin sheet of resin between the build platform and the bottom of a vat of printable feedstock. Between build layers, the platform can retract to allow the bottom of the vat to refill with un-cured resin and to offset its positioning to reflect the addition of the newly generated layer. After printing, the devices can be cleaned by rinsing with a solvent, such as isopropyl alcohol, and dried. The devices can be dried with a gas, such as nitrogen, argon, or air. For example, a nitrogen gun may be used to dry the devices. Fluidic ports of the device can be used to inject isopropyl alcohol to the microchannels, removing any uncured material filling in the internal cavities. Once free of excess resin, the parts can be cured in a UV light chamber for about 10 minutes. The bottom surfaces of the cured parts can be polished to improve optical transparency of the material.

Tumor Trapping

Stained tumor fragments can be inserted into the device to ensure consistent capture. Human tumor biopsy samples obtained from the Cooperative Human Tissue Network (Eastern Division, Philadelphia Pa., USA) can be stabbed with a hollow needle to mechanically extract fragments ranging approximately 400 to 800 µm across. The tumor fragments can be incubated at 4° C. for one hour in a solution of CellTracker Green CMFDA Dye (ThermoFisher Scientific, Waltham Mass., USA) and PBS at a concentration of 1:500 by volume. The CMFDA dye can traverse cellular membranes and can be metabolized by live cells into fluorescent and membrane-impermeable by-products. The fluorescent by-products can be retained within live cells for upwards of 72 hours, enabling prolonged monitoring of cell viability.

After incubation in CMFDA solution, the dyed tumor fragments can be inserted into the 3D-printed TAP primed with PBS. Flow from the inlet port can guide the tumor fragment through the primary channel to the tumor-trapping zone within the device, eventually landing within the tumor pocket. Fluorescent microscopy was used to confirm successful tumor fragment trapping.

Extended Tumor Viability

To be useful in the study of immunotherapy effects on tumor fragments, in some implementations, the TAP can provide an environment which can sustain tumors in the absence of therapeutics. Therefore, a long-term tumor viability experiment was conducted to verify that tumor fragments could be sustained within the printed device for an extended period of time.

A human tumor was mechanically divided into fragments roughly 450 μm in size as described before. In some implementations, a spheroid radius greater than 233±22 μm can exceed the diffusion distance of oxygen and the tissue can exhibit hypoxic effects. Therefore, tumor fragments with a minimum dimension no greater than about 450 μm were targeted for the long-term tumor viability tests to reduce the risk of cell death resulting from hypoxia. Selected tumor fragments were stained with CellTracker Green CMFDA Dye prior to insertion into the TAP device.

Tumor Fragmentation and Staining

A human tumour was mechanically divided into fragments roughly 450 μm in size as described above. Studies by Grimes et al. indicate that a spheroids radius greater than 233±22 μm exceeded the diffusion distance of oxygen and the tissue exhibited hypoxic effects. Therefore, tumour fragments with a minimum dimension no greater than 450 μm were targeted for the long-term tumour viability tests to reduce the risk of cell death resulting from hypoxia. Selected tumour fragments were stained with CellTracker Green CMFDA Dye prior to insertion into the TAP device.

System preparation. System components, including connectors, tubing, and the printed platform, can be autoclaved at 121° C., and final assembly steps can be executed in a biosafety cabinet. CMFDA-stained tumors can be inserted into devices primed with RPMI with 10% FBS and 1:100 Penicillin/Streptomycin medium containing APC Annexin V (ThermoFisher Scientific, Waltham Mass., USA), a fluorescent indicator of apoptosis, at a concentration of 1:2000 (APC/PBS by volume). Flow through the system can be maintained by a Standard PHD ULTRA™ CP Syringe Pump (Harvard Apparatus, Holliston Mass., USA) at a flow rate of about 5 μL min$^{-1}$ to continuously deliver nutrients to the tumor and remove metabolic products.

B. Results

Monitoring Tumor Health. At 24, 48, and 72 hours after tumor insertion into the TAP device, fluorescence images were taken on a series of focal planes with a ZIESS LSM 880 confocal microscope (ZEISS USA, Peabody Mass., USA). Each set of images was analysed to determine the area of live cells and the area of cells exhibiting indicators of apoptosis. For each time point, the summed area of live cells across all focal planes was normalized to the total area of fluorescing tissue. The live fraction of tumor tissue exhibited decline from 98.4% after 24 hours in the device to 69.4% after 72 hours in the device. However, because some fading of the CMFDA stain is anticipated by the 72-hour mark, the average fluorescing area per image, stained by both CMFDA and APC, was additionally monitored. Presumably, cells that are no longer viable will be stained by the circulating APC Annexin V dye. Therefore, declines in average fluorescence per image suggest that some live cells may no longer contain detectable quantities of CMFDA. Therefore, some decline in the live fraction of tissue may be attributable to fading of the CMFDA dye.

The results indicate that a 3D-printed tumor analysis platform is a viable alternative to traditionally micro-fabricated devices. In some implementations, the techniques described in this disclosure can also be useful for other applications. For example, the availability of high-resolution, transparent, and biocompatible materials that are 3D-printable using relatively inexpensive hardware can make possible the creation of other geometrically-complex biomedical devices with improved usability and production yields over existing microfluidic technologies. Integration of biocompatible pumps, valves, three-dimensional scaffolds and channel geometries can be achieved in a single microfabrication process using the principles described in this disclosure. As understanding of the additive manufacturing process and printing technology continues to develop, the prevalence and relevance of 3D-printed microfluidics will continue to grow.

C. Discussion

A 3D-printed, monolithic microfluidic device can be fabricated using the materials and methods described herein to simulate interactions between tumors and the immune system, providing a platform for testing the effectiveness of immunotherapy treatments on lymphocytes and tumor biopsies taken directly from a patient. Overlaid bright-field and fluorescence microscopy images demonstrate trapping of human tumor fragments by the 3D-printed microfluidic device, and a multi-day trapping experiment demonstrates the feasibility to keep alive a tumor fragment within the device. More broadly, high-resolution, transparent 3D-printed microfluidic devices with complex geometries can be achievable within the limits of current printing technologies, and these devices can support research activities that require extended duration studies of biological tissues under dynamic perfusion.

Photopolymerizable resins such as Pro3dure GR-10 were determined to have high resolution, optical transparency, and no cytotoxicity, which enables monolithic fabrication of complex microfluidic devices intended for biomedical applications.

Illustrative Additive Manufacturing Device and Method

Figure 8:
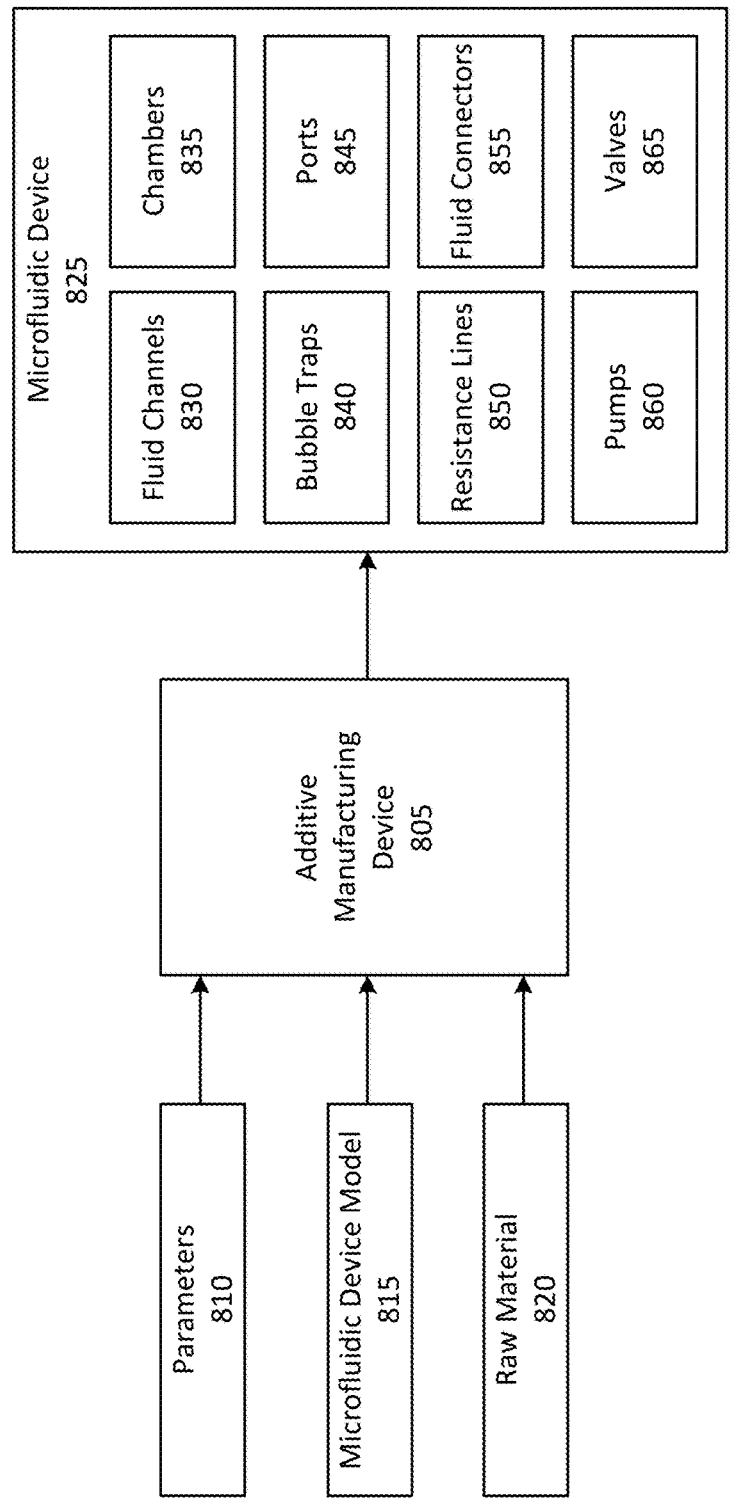
FIG. 8 is a block diagram of a system for fabricating a microfluidic device, according to an illustrative implementation.
Figure 9:
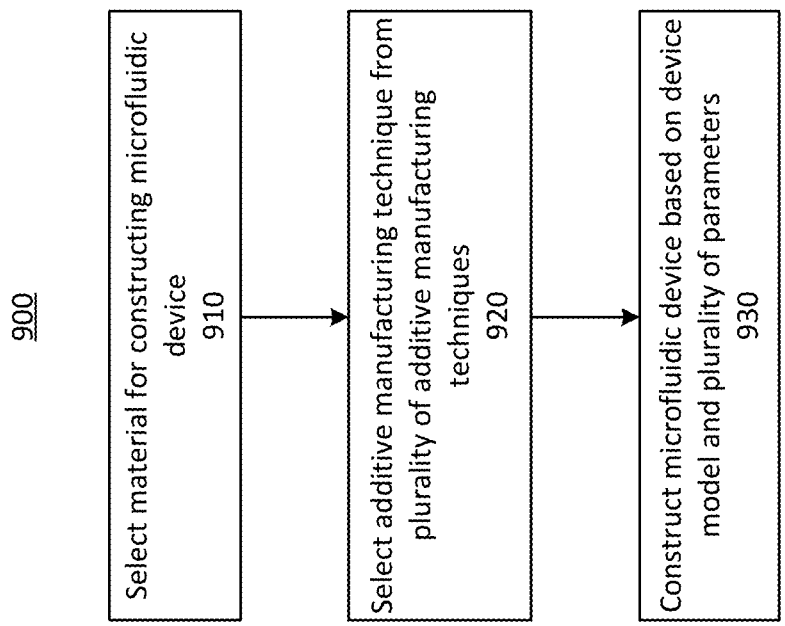
FIG. 9 is a flow chart of a method for fabricating a microfluidic device, according to an illustrative implementation.

FIG. 8 is a block diagram of a system 800 for fabricating a microfluidic device, according to an illustrative implementation. The system 800 includes an additive manufacturing device 805. The additive manufacturing technique may be designed, constructed and configured to operate using or according to any one or more additive manufacturing techniques, such as stereolithography (SLA) or digital light projection stereolithography (SLA-DLP). The additive manufacturing device 805 receives parameters 810, a microfluidic device model 815, and raw material 820. Using the parameters 810, the microfluidic device model 815, and the raw material 820, the additive manufacturing device 805 constructs a microfluidic device 825. The microfluidic device 825 can include a variety of features, including fluid channels 830, chambers 835, bubble traps 840, ports 845, resistance lines 850, fluid connectors 855, pumps 860, and valves 865. FIG. 9 is a flow chart of a method 900 for fabricating a microfluidic device, according to an illustrative implementation. In some implementations, the method 900 can be carried out via the system 800 of FIG. 8. Therefore, FIGS. 8 and 9 are described together below.

Referring now to FIG. 9, in brief overview, the method 900 can include selecting a material for constructing the microfluidic device (step 910). The method 900 can include selecting an additive manufacturing technique for fabricating the microfluidic device from a plurality of additive manufacturing techniques (step 920). Selecting the additive manufacturing technique may include selecting the additive manufacturing device that performs or provides that additive manufacturing technique. The method 900 can also include constructing the microfluidic device based on a device model and a plurality of parameters (step 930).

Referring again to FIG. 9, and in greater detail, the method 900 can include selecting a material for constructing the microfluidic device (step 910). In some implementations, the selected material can correspond to the raw material 820 shown in FIG. 8. The material can be selected based on its suitability to across a variety of characteristics. For example, as described above, some microfluidic devices can benefit from being formed by a material that is transparent and non-cytotoxic, and that can be used to fabricate features at a high resolution.

Thus, in some implementations, the material selected in step 910 of the method 900 can be selected based on having an optical property with a predetermined degree of transparency to provide viewability of a biological sample through the microfluidic device. Generally, a transparent material can be a material configured to allow light to pass such that objects can be viewed through the material. For example, the material can be selected to be substantially transparent to visible light (e.g., light having a wavelength of 390 nm-700 nm). In some implementations, the material can be selected to allow at least about 90%, at least about 95%, or at least about 99% of visible light to pass through it. In some implementations, the predetermined degree of transparency can be a degree of transparency that allows a single cell (or a single fluorescent marker having a diameter of about one micron) to be viewed through the material. In some implementations, the material can also be selected to have a low auto-fluorescence. This can help to prevent difficulty in distinguishing fluorescence from a marker inside the microfluidic device from fluorescence of the microfluidic device itself. In some implementations, the predetermined degree of transparency can be measured for a portion of the selected material having a predetermined thickness. For example, the predetermined degree of transparency may be achieved through a portion of the material having a thickness of about 100 microns to about 800 microns. In some implementations, the predetermined degree of transparency may be achieved through a portion of the material having a thickness of about 300 microns to about 500 microns. Generally, the predetermined degree of transparency may depend on the thickness of a wall of the microfluidic device through which biological sample (or a marker included in the sample) is to be viewed. In some implementations, the transparency of the material can be increased by polishing the material to reduce the surface roughness of the material.

In some implementations, the material can be selected to have a level of cytotoxicity within a predetermined threshold to provide viability of the biological sample within the microfluidic device. For example, the level of cytotoxicity may depend in part on the type of biological material that is to form the biological sample within the microfluidic device. In some implementations, the material can be selected to have a level of cytotoxicity permitting at least about 90% of cells included in the biological sample to survive over a period of at least one week in the microfluidic device. In some implementations, the material can also be selected to provide that minimum level of cytotoxicity for the biological sample in the presence of one or more drugs or medications that may also be introduced into the microfluidic device. For example, a drug or medication may be used to treat the biological sample before it is introduced into the microfluidic device, or may be flowed through the microfluidic device after the biological sample has been introduced. The biological sample may include any type or form of biological material, such as a tissue fragment, a tumor fragment, a cultured organoid, an immune cell, a mammalian cell, or a human T-lymphocyte. In some implementations, the selected material can be a methacrylate resin, such as the Pro3dure GR-10 material described above.

The method 900 can include selecting an additive manufacturing technique for fabricating the microfluidic device from a plurality of additive manufacturing techniques (step 920). For example, the additive manufacturing technique can include stereolithography (SLA) or digital light projection stereolithography (SLA-DLP). In some implementations, the additive manufacturing technique can be selected based in part on the material selected in step 910. In some implementations, the additive manufacturing technique can be selected to provide, along with the selected material, a resolution of dimensions of one or more channels (such as the fluid channels 830 shown in FIG. 8) or other features of the microfluidic device higher than a predetermined resolution threshold. For example, in some implementations, the additive manufacturing technique can be selected to allow for the fabrication of channels having a height and a width in the range of about 0.01 millimeters to about 2.5 millimeters.

The method 900 can also include constructing the microfluidic device based on a device model and a plurality of parameters (step 930). The device model can correspond to the microfluidic device model 815 and the parameters can correspond to the parameters 810 as shown in FIG. 8. In some implementations, data corresponding to the device model and data corresponding to the parameters can be provided to, uploaded to or transmitted to the additive manufacturing device 805, for example from a remote computing device. In some other implementations, data corresponding to the device model and data corresponding to the parameters can be entered into the additive manufacturing device 805 via a user interface provided by the additive manufacturing device 805. Generally, the device model can include information to be processed by the additive manufacturing device 805 to cause the additive manufacturing device 805 to construct the microfluidic device. For example, the device model can include an STL file or other type of CAD file specifying the dimensions of each layer to be produced by the additive manufacturing device 805. The dimensions of the model may be different in some aspects than the dimensions of the microfluidic device to be manufactured to account for or compensate for changes in the dimensions as a result of the selected additive manufacturing technique and/or design of the microfluidic device. In some implementations, at least one dimension specified by the device model may differ from a corresponding dimension of the actual microfluidic device. For example, the dimensions in the model may intentionally be adjusted and such a difference can help to compensate for deformations of the material that may occur during the additive manufacturing process.

Similarly, the parameters may include one or more parameters that are selected to compensate for deformation of the material that may occur during the additive manufacturing process that may tend to cause the fabricated microfluidic device to have dimensions different than those specified in the model. For example, the parameters may be selected to maintain a level of over-curing within a predetermined over-curing range. In some implementations, the parameters may include at least one parameter that relates to a curing thickness offset. For example, a curing thickness offset parameter can be in the range of about 0.01 millimeters to about 0.3 millimeters. In some implementations, the parameters can also include a parameter relating to the thickness of each layer produced during the additive manufacturing process. For example, the parameter for layer thickness can be in the range of about 0.001 millimeters to about 0.5 millimeters.

In some implementations, constructing the microfluidic device can include constructing the microfluidic device to have any combination of the features shown in the microfluidic device 825 of FIG. 8. For example, the microfluidic device 825 can include any number of fluid channels 830 or chambers 835. In some implementations, a chamber 835 can have a shape selected to hold a biological sample within a substantially fixed location within the microfluidic device 825. For example, a chamber 835 may serve as a location at which the biological sample is held in place within the microfluidic device 825 such that the biological sample can be viewed through the microfluidic device 825. Accordingly, in some implementations, a portion of the microfluidic device 825 that is adjacent to such a chamber 835 can have the optical property with the predetermined degree of transparency to provide the viewability of the biological sample as described above.

In some implementations, the microfluidic device 825 can include one or more bubble traps 840. For example, a bubble trap 840 can be coupled to a fluid channel 830 or a chamber 835 and can be configured to remove air bubbles or other gas bubbles from a fluid that flows through the fluid channel 830 or chamber 835 to which it is coupled. The microfluidic device 825 can include various ports 845, which can be configured to provide access to regions with the microfluidic device 825. For example, a port can be configured to provide access for a sensor (e.g., a pressure sensor, a flow sensor, a temperature sensor, or an optical sensor) to measure conditions in the microfluidic device 825. In some implementations, a port 845 can be configured to allow a fluid sample or biological material sample to be introduced or retrieved from the microfluidic device 825. The microfluidic device 825 can also include resistance lines 850 and fluid connectors 855. For example, fluid connectors 855 can be coupled to respective ports 845 that may couple to fluid channels 830 or chambers 835, to allow samples to be delivered into the microfluidic device 825 or collected from the microfluidic device 825. The microfluidic device 825 can also include pumps 860 and valves 865. For example, the pumps 860 and valves 865 can be configured to control flow of fluid within the microfluidic device 825.

By constructing the microfluidic device 825 according to an additive manufacturing technique (step 930), the microfluidic device 825 can be formed in a monolithic fashion. In some implementations, the microfluidic device 825 can be formed to include combinations of any of the features described above, which may be integrated into the single monolithic device. For example, the microfluidic device 825 can be formed to include a plurality of combinations of any of the features described above that may each serve as a separate device. Thus, monolithic fabrication of multiple devices at once may be achieved. Monolithic fabrication can also provide for high quality and/or high resolution transitions between various features of the microfluidic device 825. For example, transitions between fluid channels 830 or chambers 835 can be formed in a smooth manner through additive manufacturing, relative to other manufacturing techniques. Similarly, junctions between edges of walls of a fluid channel 830 or tapers within a fluid channel 830 can be fabricated more smoothly via additive manufacturing, which can help to promote laminar fluid flow within the microfluidic device 825. This is in contrast with other devices, such as those described in U.S. Patent App. No. 2002/0182241, U.S. Patent App. No. 2011/0290113, that may typically be fabricated using other techniques, such as lamination, that do not result in monolithic structures.

In some implementations, the method 900 can also include post-processing steps that are performed on the microfluidic device 825 after it is fabricated by the additive manufacturing device 805. For example, in some implementations, channels 830, chambers 835, and any other void existing within the microfluidic device 825 can be flushed with a solvent, such as alcohol, to remove excess (e.g., uncured) material. The microfluidic device 825 can also be dried with a gas, for example by using a nitrogen gun. In some implementations, microfluidic device 825 can be cured in a UV chamber.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations.

The systems and methods described herein may be embodied in other specific forms without departing from the characteristics thereof. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

We claim:

1. A microfluidic device, comprising:
a single piece construction comprising one or more channels, wherein a resolution of dimensions of the one or more channels is higher than a predetermined resolution threshold of less than 100, 150, 200 or 250 microns;
wherein the microfluidic device is constructed using an additive manufacturing technique selected to provide the resolution of dimensions of the one or more channels are higher than the predetermined resolution threshold of 100, 150, 200 or 250 microns or less;
wherein the microfluidic device is constructed by sequentially applying the additive manufacturing technique to a microfluidic device material to create a plurality of layers of the microfluidic device, based on a model for the microfluidic device and a plurality of parameters;
wherein the microfluidic device comprises a photopolymerizable polymer selected from a group consisting of a polyethyl methacrylate polymer (PEMA) or a polyethyl methacrylate-polymethyl methacrylate copolymer (PEMA-PMMA); and
wherein the microfluidic device material exhibits (1) non-cytotoxicity over an extended period of time, (2) optical transparency to visible light, (3) little to no auto-fluorescence to enable data capture of the microfluidic device operation via fluorescent images, and (4)

high-resolution fabrication to be able to reproduce small features of less than 100 microns.

2. The microfluidic device of claim 1, wherein the additive manufacturing technique is 3D printing.

3. The microfluidic device of claim 1, wherein the additive manufacturing technique comprises one of stereolithography (SLA) or digital light projection stereolithography (SLA-DLP).

4. The microfluidic device of claim 1, wherein the plurality of parameters comprises a predetermined parameter for layer thickness.

5. The microfluidic device of claim 4, wherein the predetermined parameter for layer thickness is in the range of about 0.001 millimeters to about 0.5 millimeters.

6. The microfluidic device of claim 4, wherein the plurality of parameters comprises a predetermined parameter for curing thickness offset.

7. The microfluidic device of claim 6, wherein the predetermined parameter for curing thickness offset is in the range of about 0.01 millimeters to about 0.3 millimeters.

8. The microfluidic device of claim 1, wherein the one or more channels of the microfluidic device have a height in the range of about 0.01 millimeters to about 2.5 millimeters and a width in the range of about 0.01 millimeters to about 2.5 millimeters.

9. The microfluidic device of claim 1, wherein the microfluidic device material provides survival of at least 90% of cells included in a biological sample over for at least one week.

10. The microfluidic device of claim 1 wherein the microfluidic device material includes at least 50%, or 60% or 70% by weight of polyethyl methacrylate polymer or copolymer.

11. The microfluidic device of claim 10 wherein at least 90% or at least 95% by mass of the microfluidic device material includes polyethyl methacrylate polymer or polyethyl methacrylate copolymer, and a second monomer in which the polyethyl methacrylate polymer is at least partially soluble and comprises an alkyl acrylate or an alkyl methacrylate monomer, wherein the alkyl acrylate or the alkyl methacrylate monomer is a monomer of methacrylate group methyl methacrylate, ethyl methacrylate, ethyl acrylate, ethoxyethyl acrylate, tetrahydrofurfuryl methacrylate, tetrahydrofurfuryl acrylate, isobornyl acrylate or isobornyl methacrylate and ethoxyethyl methacrylate.

12. The microfluidic device of claim 11, wherein the microfluidic device material includes a flexibilizer or a catalyst.

13. A microfluidic device, comprising:
a single piece construction comprising one or more channels, wherein a resolution of dimensions of the one or more channels is higher than a predetermined resolution threshold of less than 100, 150, 200 or 250 microns;
wherein the microfluidic device is constructed using an additive manufacturing technique, the additive manufacturing technique selected to provide the resolution of dimensions of the one or more channels are higher than the predetermined resolution threshold of 100, 150, 200 or 250 microns or less;
wherein the microfluidic device is constructed based on a model for the microfluidic device and a plurality of parameters, the plurality of parameters comprising a predetermined parameter for layer thickness and a predetermined parameter for curing thickness offset in the range of about 0.01 millimeters to about 0.3 millimeters; and wherein the microfluidic device exhibits (1) non-cytotoxicity over an extended period of time, (2) optical transparency to visible light, (3) little to no autofluorescence to enable data capture of the microfluidic device operation via fluorescent images, and/or (4) high-resolution fabrication to be able to reproduce small features of less than 100 microns.

14. The microfluidic device of claim 13, wherein the additive manufacturing technique is 3D printing.

15. The microfluidic device of claim 13, wherein the additive manufacturing technique comprises one of stereolithography (SLA) or digital light projection stereolithography (SLA-DLP).

16. The microfluidic device of claim 13, wherein the predetermined parameter for layer thickness is in the range of about 0.001 millimeters to about 0.5 millimeters.

17. The microfluidic device of claim 13, wherein the one or more channels of the microfluidic device have a height in the range of about 0.01 millimeters to about 2.5 millimeters and a width in the range of about 0.01 millimeters to about 2.5 millimeters.

18. The microfluidic device of claim 13, wherein the microfluidic device provides survival of at least 90% of cells included in a biological sample over for at least one week.

19. The microfluidic device of claim 13, comprising a polymer selected from a group consisting of polyetheretherketone ("PEEK"), polymethylacrylamide or polyacrylamide, polyvinylalcohol, polycaprolactone and polylactide.

20. The microfluidic device of claim 13 comprising a photopolymerizable polymer selected from a group consisting of a polyethyl methacrylate polymer (PEMA) or a polyethyl methacrylate-polymethyl methacrylate copolymer (PEMA-PMMA).

21. The microfluidic device of claim 20 wherein the microfluidic device includes at least 50%, or 60% or 70% by weight of polyethyl methacrylate polymer or copolymer.

22. The microfluidic device of claim 21 wherein at least 90% or at least 95% by mass of the microfluidic device includes polyethyl methacrylate polymer or polyethyl methacrylate copolymer, and a second monomer in which the polyethyl methacrylate polymer is at least partially soluble and comprises an alkyl acrylate or an alkyl methacrylate monomer, wherein the alkyl acrylate or the alkyl methacrylate monomer is a monomer of methacrylate group methyl methacrylate, ethyl methacrylate, ethyl acrylate, ethoxyethyl acrylate, tetrahydrofurfuryl methacrylate, tetrahydrofurfuryl acrylate, isobornyl acrylate or isobornyl methacrylate and ethoxyethyl methacrylate.

23. The microfluidic device of claim 22 wherein the microfluidic device includes a flexibilizer or a catalyst.

24. A microfluidic device, comprising:
a single piece construction comprising one or more channels, wherein a resolution of dimensions of the one or more channels is higher than a predetermined resolution threshold of less than 100, 150, 200 or 250 microns;
wherein the microfluidic device is constructed using an additive manufacturing technique selected to provide the resolution of dimensions of the one or more channels are higher than the predetermined resolution threshold of 100, 150, 200 or 250 microns or less;
wherein the microfluidic device is constructed by sequentially applying the additive manufacturing technique to a microfluidic device material to create a plurality of layers of the microfluidic device, based on a model for the microfluidic device and a plurality of parameters;

wherein the microfluidic device comprises a polymer selected from a group consisting of polyetheretherketone ("PEEK"), polymethylacrylamide or polyacrylamide, polyvinylalcohol, polycaprolactone and polylactide; and wherein the microfluidic device material exhibits (1) non-cytotoxicity over an extended period of time, (2) optical transparency to visible light, (3) little to no auto-fluorescence to enable data capture of the microfluidic device operation via fluorescent images, and (4) high-resolution fabrication to be able to reproduce small features of less than 100 microns.

\* \* \* \* \*